(12) United States Patent
Lee et al.

(10) Patent No.: US 10,329,409 B2
(45) Date of Patent: Jun. 25, 2019

(54) PHOTOSENSITIVE RESIN COMPOSITION AND DISPLAY DEVICE INCLUDING COLOR CONVERSION LAYER PREPARED BY USING THE SAME

(71) Applicants: Samsung Display Co., Ltd., Yongin-si, Gyeonggi-do (KR); Dongwoo Fine-Chem Co., Ltd., Iksan-si, Jeollabuk-do (KR)

(72) Inventors: Baek Hee Lee, Yongin-si (KR); Min Ki Nam, Anseong-si (KR); Young Min Kim, Ansan-si (KR); Kyoung Won Park, Seoul (KR); Hae Il Park, Seoul (KR); Ju Ho Kim, Pyeongtaek-si (KR); Hyoun Woo Kim, Pyeongtaek-si (KR); Hun Sik Kim, Incheon (KR); Jong Soo Lee, Pyeongtaek-si (KR); Hyun Jung Wang, Seoul (KR)

(73) Assignees: Samsung Display Co., Ltd., Yongin-si (KR); Dongwoo Fine-Chem Co., Ltd., Iksan-si (KR)

( * ) Notice: Subject to any disclaimer, the term of this patent is extended or adjusted under 35 U.S.C. 154(b) by 284 days.

(21) Appl. No.: 15/399,153

(22) Filed: Jan. 5, 2017

(65) Prior Publication Data
US 2017/0240728 A1    Aug. 24, 2017

(30) Foreign Application Priority Data

Feb. 22, 2016 (KR) .................. 10-2016-0020527

(51) Int. Cl.
| | | |
|---|---|---|
| *C08K 7/18* | (2006.01) | |
| *B82Y 30/00* | (2011.01) | |
| *B82Y 40/00* | (2011.01) | |
| *C09K 11/02* | (2006.01) | |
| *C09K 11/88* | (2006.01) | |
| *H01L 27/32* | (2006.01) | |
| *H01L 51/00* | (2006.01) | |
| *H01L 51/52* | (2006.01) | |
| *C08F 220/06* | (2006.01) | |
| *C08F 220/14* | (2006.01) | |
| *C08F 222/20* | (2006.01) | |
| *G02F 1/1335* | (2006.01) | |
| *G02F 1/1362* | (2006.01) | |
| *G02F 1/1368* | (2006.01) | |

(52) U.S. Cl.
CPC .............. *C08K 7/18* (2013.01); *C08F 220/06* (2013.01); *C08F 220/14* (2013.01); *C08F 222/20* (2013.01); *C09K 11/025* (2013.01); *C09K 11/883* (2013.01); *G02F 1/1368* (2013.01); *G02F 1/133512* (2013.01); *G02F 1/133528* (2013.01); *G02F 1/133621* (2013.01); *G02F 1/136286* (2013.01); *H01L 27/3244* (2013.01); *H01L 51/004* (2013.01); *H01L 51/0043* (2013.01); *H01L 51/5262* (2013.01); *B82Y 30/00* (2013.01); *B82Y 40/00* (2013.01); *G02F 2001/133519* (2013.01); *G02F 2001/133614* (2013.01); *G02F 2202/36* (2013.01); *Y10S 977/774* (2013.01); *Y10S 977/896* (2013.01); *Y10S 977/95* (2013.01)

(58) Field of Classification Search
CPC ............ C09K 11/025; G02F 1/133512; G02F 1/133528; G02F 1/133621; G02F 1/1368; G02F 1/136286
See application file for complete search history.

(56) References Cited

U.S. PATENT DOCUMENTS

| | | | | |
|---|---|---|---|---|
| 9,637,683 B2* | 5/2017 | Lee | ........................ | G03F 7/0007 |
| 10,108,089 B2* | 10/2018 | Gu | .......................... | G03F 7/027 |

FOREIGN PATENT DOCUMENTS

| | | |
|---|---|---|
| JP | 2015-121702 | 7/2015 |
| JP | 2015-125197 | 7/2015 |
| KR | 10-2012-0007780 | 1/2012 |
| KR | 10-2014-0046840 | 4/2014 |
| KR | 10-2014-0113131 | 9/2014 |
| WO | WO 2015/100968 | * 7/2015 |

* cited by examiner

*Primary Examiner* — C Melissa Koslow
(74) *Attorney, Agent, or Firm* — Lewis Roca Rothgerber Christie LLP (57) ABSTRACT

A photosensitive resin composition according to an example embodiment of the present disclosure includes a quantum dot, a photopolymerizable compound, a photopolymerization initiator, an alkali-soluble resin, and a solvent, wherein the alkali-soluble resin includes at least one of a monomer represented by Formula 1 and a monomer represented by Formula 2:

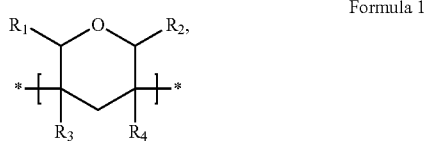

Formula 1

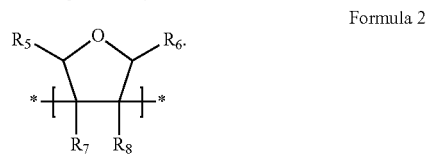

Formula 2

22 Claims, 4 Drawing Sheets

PHOTOSENSITIVE RESIN COMPOSITION AND DISPLAY DEVICE INCLUDING COLOR CONVERSION LAYER PREPARED BY USING THE SAME

CROSS-REFERENCE TO RELATED APPLICATION

This application claims priority to and the benefit of Korean Patent Application No. 10-2016-0020527 filed in the Korean Intellectual Property Office on Feb. 22, 2016, the entire content of which is incorporated herein by reference.

BACKGROUND

One or more aspects of example embodiments of the present disclosure are related to a photosensitive resin composition and a display device including a color conversion layer prepared using the same.

A color filter may be manufactured using a red (R), green (G), or blue (B) dye or pigment, and these coloring materials have the function of representing light irradiated from a light source in each corresponding color (e.g., the function of converting irradiated light into a corresponding color). When a spectrum of the coloring material has a required absorption wavelength without an unnecessary wavelength and has an absorption band of a narrow width (e.g., when the absorption spectrum of the coloring material does not include superfluous bands or is monochromatic, and the absorption band width of the coloring material is suitably narrow), the color characteristics of the color filter may be improved.

A photosensitive resin composition used for manufacturing a pixel color filter may include a photopolymerizable compound, a photopolymerization initiator, a colorant, a solvent, and other additives.

A pixel color filter using the photosensitive resin composition may be manufactured by coating photosensitive resin compositions of a plurality of colors on a transparent substrate using a staining method, an electrodeposition method, a printing method, a pigment dispersion method, etc. Recently, the pigment dispersion method has been improved, and is now widely used to achieve excellent color reproducibility and durability against heat, light, and moisture.

In this case, the pigment may have a limit in ensuring excellent luminance characteristics. Recently, color conversion layers (e.g., layers having a function of representing or changing the color) have been formed using a quantum dot or phosphor as configuration components instead of the pigment in an effort to improve device luminance characteristics.

Color conversion layers having even better luminance and thermal resistance properties are increasingly being required by quality specifications. However, there is a problem that the photo-efficiency and/or the color reproducibility may be decreased due to the heat generated in a patterning process.

The above information disclosed in this Background section is included only to enhance understanding of the background of the present disclosure, and may therefore contain information that does not form the prior art that is already known in this country to a person of ordinary skill in the art.

SUMMARY

One or more aspects of example embodiments of the present disclosure are directed toward a photosensitive resin composition improving photo-efficiency and/or color reproducibility, and a display device including a color conversion layer manufactured using the same.

One or more example embodiments of the present disclosure provide a photosensitive resin composition including a quantum dot (e.g., quantum dots), a photopolymerizable compound, a photopolymerization initiator, an alkali-soluble resin, and a solvent, wherein the alkali-soluble resin includes at least one of a monomer represented by Formula 1 and a monomer represented by Formula 2:

Formula 1

Formula 2

In Formula 1, $R_1$, $R_2$, $R_3$, and $R_4$ may each independently represent a hydrogen atom, a halogen atom, an alkyl group having 1 to 20 carbons, an alkoxy group having 1 to 20 carbons, a carbonyl group, an alkoxy carbonyl group, or an alkenyl group having 2 to 20 carbons, and in Formula 2, $R_5$, $R_6$, $R_7$, and $R_8$ may each independently represent a hydrogen atom, a halogen atom, an alkyl group having 1 to 20 carbons, an alkoxy group having 1 to 20 carbons, a carbonyl group, an alkoxy carbonyl group, or an alkenyl group having 2 to 20 carbons.

The alkali-soluble resin may include at least one of a polymer formed from the monomer represented by Formula 1 and a polymer formed from the monomer represented by Formula 2.

The alkali-soluble resin may further include a monomer represented by Formula 3:

Formula 3

In Formula 3, $R_9$ may be a hydrogen atom or an alkyl group having 1 to 20 carbons.

The alkali-soluble resin may include at least one selected from a copolymer formed from the monomer represented by Formula 1 and the monomer represented by Formula 3, and a copolymer formed from the monomer represented by Formula 2 and the monomer represented by Formula 3.

A sum (e.g., amount or concentration) of the monomer represented by Formula 1 or a sum (e.g., amount or concentration) of the monomer represented by Formula 2 may be 50 mol % to 90 mol % in the alkali-soluble resin, and a sum (e.g., amount or concentration) of the monomer represented by Formula 3 may be 10 mol % to 50 mol % in the alkali-soluble resin, based on the total moles of the monomer represented by Formula 1, the monomer represented by Formula 2, and the monomer represented by Formula 3.

The quantum dot may include one selected from a red quantum dot, a green quantum dot, and a blue quantum dot.

The quantum dots may be present in the photosensitive resin composition at an amount of 3 wt % to 80 wt % based on the entire solid weight of the photosensitive resin composition.

The photopolymerizable compound may include at least one selected from nonylphenyl carbitol acrylate, 2-hydroxy-3-phenoxypropyl acrylate, 2-ethylhexyl carbitol acrylate, 2-hydroxyethyl acrylate, N-vinylpyrrolidone, 1,6-hexanediol di(meth)acrylate, ethylene glycol di(meth)acrylate, neopentyl glycol di(meth)acrylate, triethylene glycol di(meth)acrylate, bisphenol A bis(acryloyloxyethyl)ether, 3-methylpentanediol di(meth)acrylate, trimethylol propane tri(meth)acrylate, pentaerythritol tri(meth)acrylate, pentaerythritol tetra(meth)acrylate, dipentaerythritol penta(meth)acrylate, and dipentaerythritol hexa(meth)acrylate.

The photopolymerizable compound may be present in the photosensitive resin composition at an amount of 5 wt % to 70 wt % based on the entire solid weight of the photosensitive resin composition.

The photopolymerization initiator may include at least one selected from a triazine-based compound, an acetophenone-based compound, a biimidazole-based compound, an oxime compound, a benzoin-based compound, a benzophenone-based compound, a thioxanthone-based compound, and an anthracene-based compound.

The photopolymerization initiator may be present in the photosensitive resin composition at an amount of 0.1 wt % to 20 wt % based on the entire solid weight of the photosensitive resin composition.

The photosensitive resin composition may further include a photopolymerization initiation aid, and the photopolymerization initiation aid may include at least one selected from an amine compound and a carboxylic acid compound.

Based on the entire solid weight of the photosensitive resin composition, the quantum dot may be present in an amount of 3 wt % to 80 wt %, the photopolymerizable compound may be present in an amount of 5 wt % to 70 wt %, the photopolymerization initiator may be present in an amount of 0.1 wt % to 20 wt %, the alkali-soluble resin may be present in an amount of 5 wt % to 80 wt %, and the solvent may be present in an amount of 60 wt % to 90 wt %.

A display device according to an example embodiment of the present disclosure includes a color conversion layer, wherein the color conversion layer is formed from a photosensitive resin composition including a quantum dot, a photopolymerizable compound, a photopolymerization initiator, an alkali-soluble resin, and a solvent, wherein the alkali-soluble resin includes at least one of a monomer represented by Formula 1 and a monomer represented by Formula 2:

Formula 1

Formula 2

In Formula 1, $R_1$, $R_2$, $R_3$, and $R_4$ may each independently represent a hydrogen atom, a halogen atom, an alkyl group having 1 to 20 carbons, an alkoxy group having 1 to 20 carbons, a carbonyl group, an alkoxy carbonyl group, or an alkenyl group having 2 to 20 carbons, and in Formula 2, $R_5$, $R_6$, $R_7$, and $R_8$ may each independently represent a hydrogen atom, a halogen atom, an alkyl group having 1 to 20 carbons, an alkoxy group having 1 to 20 carbons, a carbonyl group, an alkoxy carbonyl group, or an alkenyl group having 2 to 20 carbons.

The alkali-soluble resin may include at least one of a polymer formed from the monomer represented by Formula 1 and a polymer formed from the monomer represented by Formula 2.

The alkali-soluble resin may further include a monomer represented by Formula 3:

Formula 3

In Formula 3, $R_9$ may be a hydrogen atom or an alkyl group having 1 to 20 carbons.

The alkali-soluble resin may include at least one selected from a copolymer formed from the monomer represented by Formula 1 and the monomer represented by Formula 3, and a copolymer formed from the monomer represented by Formula 2 and the monomer represented by Formula 3.

The color conversion layer may include a red color conversion layer and a green color conversion layer, and may further include a transmission layer between the red color conversion layer and the green color conversion layer.

The display device may further include a backlight assembly, and the backlight assembly may be a blue light source.

The display device may further include a backlight assembly, a display panel, and a color conversion panel, the display panel may be on the backlight assembly, the color conversion panel may be on the display panel, and the color conversion panel may include the color conversion layer.

The display device may further include an upper polarizer and a lower polarizer on respective surfaces of the display panel, and the color conversion layer may be on the upper polarizer.

The display device may further include a first electrode, a second electrode overlapping the first electrode, and an emission layer between the first electrode and the second electrode, and the emission layer may be a blue emission layer.

The color conversion layer manufactured using the photosensitive resin composition including the alkali-soluble resin according to an example embodiment of the present disclosure may suppress or reduce oxidation of the quantum dot during the manufacturing process, such that excellent emission intensity may be maintained. The display device including the color conversion layer may achieve excellent quality.

BRIEF DESCRIPTION OF THE DRAWINGS

The accompanying drawings together with the specification illustrate embodiments of the subject matter of the present disclosure, and together with the description serve to explain principles of embodiments of the subject matter of the present disclosure.

DETAILED DESCRIPTION OF THE EMBODIMENTS

The present disclosure will be described more fully hereinafter with reference to the accompanying drawings, in which example embodiments of the present disclosure are shown. As those skilled in the art would realize, the described embodiments may be modified in various different ways, all without departing from the spirit or scope of the present disclosure.

Like reference numerals refer to like elements throughout, and duplicative descriptions thereof may not be provided.

The sizes and thicknesses of each configuration shown in the drawings may be arbitrarily shown for ease of description and to enable better understanding of each configuration, but embodiments of the present disclosure are not limited thereto. In the drawings, the thicknesses of layers, films, panels, regions, areas, etc., may be exaggerated for clarity and ease of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "~on" may refer to positioning on or below the object portion, but does not necessarily refer to positioning on the upper side of the object (based on a gravity direction).

Unless explicitly described to the contrary, the word "comprise" and variations such as "comprises" or "comprising" will be understood to imply the inclusion of stated elements, but not the exclusion of any other elements.

In the present specification and claims, "*" may refer to a point of connection to the same or different atom or formula group.

A photosensitive resin composition according to an example embodiment of the present disclosure includes a quantum dot, a photopolymerizable compound, a photopolymerization initiator, an alkali-soluble resin, and a solvent. As used herein, the term "quantum dot" encompasses both singular and plural uses, and may indicate a single quantum dot or multiple quantum dots.

When the alkali-soluble resin included in the photosensitive resin composition has a main ring structure like Formula 1 or Formula 2, a substantially stable dispersion including a quantum dot and other compositions (e.g., materials) may be formed. Accordingly, oxygen inhibition may be decreased when radical curing is performed, resulting in excellent curability.

Formula 1

In Formula 1, $R_1$, $R_2$, $R_3$, and $R_4$ may each independently represent a hydrogen atom, a halogen atom, an alkyl group having 1 to 20 carbons, an alkoxy group having 1 to 20 carbons, a carbonyl group, an alkoxy carbonyl group, or an alkenyl group having 2 to 20 carbons.

Formula 2

In Formula 2, $R_5$, $R_6$, $R_7$, and $R_8$ may each independently represent a hydrogen atom, a halogen atom, an alkyl group having 1 to 20 carbons, an alkoxy group having 1 to 20 carbons, a carbonyl group, an alkoxy carbonyl group, or an alkenyl group having 2 to 20 carbons.

The alkali-soluble resin may be a single polymer including the repeat unit of Formula 1 or a single polymer including the repeat unit of Formula 2 alone, or it may be at least one selected from a copolymer formed from a monomer represented by Formula 1 and an unsaturated monomer represented by Formula 3, and a copolymer formed from a monomer represented by Formula 2 and an unsaturated monomer represented by Formula 3. As used herein, the term "polymer formed from Formula 1", for example, may indicate "a polymer including a reaction product of monomers represented by Formula 1".

Formula 3

In Formula 3, $R_9$ may be a hydrogen atom or an alkyl group having 1 to 20 carbons.

A more detailed description of the alkali-soluble resin will be provided elsewhere herein.

Quantum Dot

The quantum dot included in the photosensitive resin composition may include at least one selected from a red quantum dot, a green quantum dot, and a blue quantum dot. As used herein, the term "quantum dot" refers to a substantially spherical semiconductor particle having a nanometer scale diameter. When a quantum dot receives energy from the outside and is promoted to an excited state, it may emit light of a wavelength determined by its energy band gap.

The photosensitive resin composition according to an example embodiment of the present disclosure may include the quantum dot such that a color conversion layer manufactured using this photosensitive resin composition may emit light (e.g., via the quantum dot). A display device including the color conversion layer manufactured using the photosensitive resin composition may have excellent color reproducibility, and because light is emitted in all directions by the quantum dot, the viewing angle may also be improved.

The quantum dot according to an example embodiment of the present disclosure may be used without limitation, as long as the quantum dot is capable of light emission after stimulation by light (e.g., light absorption). The materials for forming the quantum dot may be selected from a Group II-VI semiconductor compound (e.g., a semiconductor compound including a Group II element and a Group VI element), a Group III-V semiconductor compound (e.g., a semiconductor compound including a Group III element and a Group V element), a Group IV-VI semiconductor compound (e.g., a semiconductor compound including a Group IV element and a Group VI element), a Group IV element, a compound including the same, and combinations thereof. As used herein, the terms "combination", "combination thereof", and "combinations thereof" may refer to a chemical combination (e.g., an alloy or chemical compound), a mixture, or a laminated structure of components. The quantum dot may be used alone or as a combination of two or more kinds.

The Group II-VI semiconductor compound may be selected from a binary compound (e.g., selected from a group including CdS, CdSe, CdTe, ZnS, ZnSe, ZnTe, ZnO, HgS, HgSe, HgTe, and mixtures thereof), a ternary compound (e.g., selected from a group including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, and mixtures thereof), and a quaternary compound (e.g., selected from a group including CdZnSeS, CdZnSeTe, CdZnSTe, CdHgSeS, CdHgSeTe, CdHgSTe, HgZnSeS, HgZnSeTe, HgZnSTe, and mixtures thereof).

The Group III-V semiconductor compound may be selected from a binary compound (e.g., selected from a group including GaN, GaP, GaAs, GaSb, AlN, AlP, AlAs, AlSb, InN, InP, InAs, InSb, and mixtures thereof), a ternary compound (e.g., selected from a group including GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and mixtures thereof), and a quaternary compound (e.g., selected from a group including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof).

The Group IV-VI semiconductor compound may be selected from a binary compound (e.g., selected from a group including SnS, SnSe, SnTe, PbS, PbSe, PbTe, and mixtures thereof), a ternary compound (e.g., selected from a group including SnSeS, SnSeTe, SnSTe, PbSeS, PbSeTe, PbSTe, SnPbS, SnPbSe, SnPbTe, and mixtures thereof), and a quaternary compound (e.g., selected from a group including SnPbSSe, SnPbSeTe, SnPbSTe, and mixtures thereof).

The Group IV element may be selected from a group including Si, Ge, and mixtures thereof, and the Group IV compound may be a binary compound selected from a group including SiC, SiGe, and mixtures thereof.

The quantum dot may have a homogeneous single structure, a double structure such as a core-shell, a gradient structure, or a mixture thereof.

In the double structure of the core-shell, each material forming the core and the shell may be made of the above-described different semiconductor compounds. For example, the core may include at least one material selected from a group including CdSe, CdS, ZnS, ZnSe, CdTe, CdSeTe, CdZnS, PbSe, AgInZnS, and ZnO, but embodiments of the present disclosure are not limited thereto. The shell may include at least one material selected from a group including CdSe, ZnSe, ZnS, ZnTe, CdTe, PbS, TiO, SrSe, and HgSe, but embodiments of the present disclosure are not limited thereto.

The coloring photosensitive resin composition used for manufacturing the general color filter may include a coloring material of red, green, and/or blue for realizing the color. The quantum dot may also be classified as a red quantum dot, a green quantum dot, a blue quantum dot, and the quantum dot according to an example embodiment of the present disclosure may be a red quantum dot, a green quantum dot, or a blue quantum dot.

The quantum dot may be synthesized using a wet chemical process, organic metal organic chemical vapor deposition (MOCVD), or molecular beam epitaxy (MBE).

The wet chemical process may be a method of adding a precursor material to an organic solvent to grow particles. An organic solvent is naturally coordinated to the surface of the quantum dot crystals and acts as a dispersing agent, such that crystal growth may be controlled. Accordingly, the growth of the nanoparticle may be controlled through an easy and affordable process compared with vapor deposition (such as organic metal chemical deposition or the molecular beam epitaxy).

The content (e.g., amount or concentration) of the quantum dot according to an example embodiment of the present disclosure is not limited, and for example, may be included in an amount of 3 wt % to 80 wt %, and in some embodiments, in an amount of 5 wt % to 70 wt % based on the total solid weight of the photosensitive resin composition. When the content is less than 3 wt %, the emitting efficiency (e.g., emission efficiency) may be reduced or minimal, while if the content is more than 80 wt %, the content of other components may be leaked (e.g., insufficient or unstable), such that it becomes difficult to form the pattern.

Photopolymerizable Compound

The photopolymerizable compound included in the photosensitive resin composition according to an example embodiment of the present disclosure is a compound that may be polymerized by light. The photopolymerization initiator may be a single functional monomer, a double functional monomer, and/or another multifunctional monomer. Non-limiting examples of the single functional monomer may include nonylphenyl carbitol acrylate, 2-hydroxy-3-phenoxypropylacrylate, 2-ethylhexyl carbitol acrylate, 2-hydroxyethylacrylate, N-vinylpyrrolidone, etc.

Non-limiting examples of the double functional monomer may include 1,6-hexanediol di(meth)acrylate, ethylene glycol di(meth)acrylate, neopentyl glycol di(meth)acrylate, triethylene glycol di(meth)acrylate, bisphenol A bis(acryloyloxyethyl)ether, 3-methylpentanediol di(meth)acrylate, etc.

Non-limiting examples of the other multifunctional monomer may include trimethylol propane tri(meth)acrylate, pentaerythritol tri(meth)acrylate, pentaerythritol tetra(meth)acrylate, dipentaerythritol penta(meth)acrylate, dipentaerythritol hexa(meth)acrylate, etc. In some embodiments, a multifunctional monomer of two or more functional groups may be used. The photopolymerizable compound may be included at 5 wt % to 50 wt %, and in some embodiments, 7 wt % to 45 wt %, wherein the amount is expressed as a weight ratio versus the solid content of the photosensitive resin composition. When the photopolymerizable compound is included in the photosensitive resin composition at 5 wt % to 50 wt % in the color conversion layer manufactured using the photopolymerizable compound, the strength and/or smoothness of the pixel unit in the display device may be excellent.

Photopolymerization Initiator

The photopolymerization initiator included in the photosensitive resin composition according to an example embodiment of the present disclosure is not limited. However it may be a compound of one or more kinds, and may be selected from a triazine-based compound, an acetophenone-based compound, a biimidazole-based compound, and an oxime compound. A photosensitive resin composition including the photopolymerization initiator may have high sensitivity, and the strength of the pattern characteristic of the pixel unit corresponding to the color conversion layer formed by using these compositions may be good.

Also, when the photopolymerization initiation aid is added to the photopolymerization initiator, the sensitivity of the photosensitive resin composition including the photopolymerization initiation aid may be increased, such that the productivity when forming the color conversion layer by using these compositions is improved.

Non-limiting examples of the triazine-based compound may include 2,4-bis(trichloromethyl)-6-(4-methoxyphenyl)-1,3,5-triazine, 2,4-bis(trichloromethyl)-6-(4-methoxynaphthyl)-1,3,5-triazine, 2,4-bis(trichloromethyl)-6-piperonyl-1,3,5-triazine, 2,4-bis(trichloromethyl)-6-(4-methoxystyryl)-1,3,5-triazine, 2,4-bis(trichloromethyl)-6-[2-(5-methylfuran-2-yl)ethenyl]-1,3,5-triazine, 2,4-bis(trichloromethyl)-6-[2-(furan-2-yl)ethenyl]-1,3,5-triazine, 2,4-bis(trichloromethyl)-6-[2-(4-diethylamino-2-methylphenyl)ethenyl]-1,3,5-triazine, 2,4-bis(trichloromethyl)-6-[2-(3,4-dimethoxyphenyl)ethenyl]-1,3,5-triazine, etc.

Non-limiting examples of the acetophenone-based compound may include diethoxyacetophenone, 2-hydroxy-2-methyl-1-phenylpropan-1-one, benzyl dimethyl ketal, 2-hydroxy-1-[4-(2-hydroxyethoxy)phenyl]-2-methylpropan-1-one, 1-hydroxycyclohexyl phenyl ketone, 2-methyl-1-(4-methyl phenyl)-2-morpholinopropan-1-one, 2-benzyl-2-dimethyl amino-1-(4-morpholinophenyl)butan-1-one, an oligomer of 2-hydroxy-2-methyl-1-[4-(1-methylvinyl)phenyl]propan-1-one, etc. In some embodiments, a compound represented by Formula 4 may be included:

Formula 4

In Formula 4,

$R_{10}$ to $R_{13}$ may each independently be a hydrogen atom, a halogen atom, a hydroxyl group, an unsubstituted phenyl group, a phenyl group substituted with an alkyl group having 1 to 12 carbons, an unsubstituted benzyl group, a benzyl group substituted with an alkyl group having 1 to 12 carbons, an unsubstituted naphthyl group, or a naphthyl group substituted with an alkyl group having 1 to 12 carbons.

Non-limiting examples of the compound represented by Formula 4 may include 2-methyl-2-amino (4-morpholinophenyl)ethan-1-one, 2-ethyl-2-amino(4-morpholinophenyl)ethan-1-one, 2-propyl-2-amino(4-morpholinophenyl)ethan-1-one, 2-butyl-2-amino(4-morpholinophenyl)ethan-1-one, 2-methyl-2-amino(4-morpholinophenyl)propan-1-one, 2-methyl-2-amino(4-morpholinophenyl)butan-1-one, 2-ethyl-2-amino(4-morpholinophenyl)propan-1-one, 2-ethyl-2-amino(4-morpholinophenyl)butan-1-one, 2-methyl-2-methylamino(4-morpholinophenyl)propan-1-one, 2-methyl-2-dimethylamino(4-morpholinophenyl)propane-1-on, 2-methyl-2-diethylamino(4-morpholinophenyl)propan-1-one, etc.

Non-limiting examples of the biimidazole compound may include 2,2'-bis(2-chlorophenyl)-4,4',5,5'-tetraphenyl biimidazole, 2,2'-bis(2,3-dichlorophenyl)-4,4',5,5'-tetraphenyl biimidazole, 2,2'-bis(2-chlorophenyl)-4,4',5,5'-tetra(alkoxyphenyl) biimidazole, 2,2'-bis(2-chlorophenyl)-4,4',5,5'-tetra(trialkoxyphenyl) biimidazole, a biimidazole compound in which a phenyl group at position 4, 4', 5, or 5' is substituted with a carboalkoxy group, etc. In some embodiments, 2,2'-bis(2-chlorophenyl)-4,4',5,5'-tetraphenyl biimidazole or 2,2'-bis(2,3-dichlorophenyl)-4,4',5,5'-tetraphenyl biimidazole may be used.

The oxime compound may be represented by one of Formulae 5, 6, or 7:

Formula 5

Formula 6

Formula 7

Also, as long as the effects according to an example embodiment of the present disclosure are not impaired (e.g., negatively affected), other photopolymerization initiators available in the art may be used in combination with the photopolymerization initiators according to embodiments of the present disclosure. Non-limiting examples of such photopolymerization initiators may include benzoin-based compounds, benzophenone-based compounds, thioxanthone-based compounds, anthracene-based compounds, etc. They may be used alone or in a combination of two or more kinds.

Non-limiting examples of the benzoin-based compound may include benzoin, benzoin methylether, benzoin ethylether, benzoin isopropylether, benzoin isobutylether, etc.

Non-limiting examples of the benzophenone-based compound may include benzophenone, ortho-benzoylbenzoate methyl, 4-phenyl benzophenone, 4-benzoyl-4'-methyldiphenylsulfide, 3,3',4,4'-tetra(tert-butylperoxycarbonyl)benzophenone, 2,4,6-trimethylbenzophenone, 4,4'-di(N,N'-dimethylamino)-benzophenone, etc.

Non-limiting examples of the thioxanthone-based compound may include 2-isopropylthioxanthone, 2,4-diethylthioxanthone, 2,4-dichlorothioxanthone, 1-chloro-4-propoxythioxanthone, etc.

Non-limiting examples of the anthracene-based compound may include 9,10-dimethoxyanthracene, 2-ethyl-9,10-dimethoxyanthracene, 9,10-diethoxyanthracene, 2-ethyl-9,10-diethoxyanthracene, etc.

In some embodiments, 2,4,6-trimethylbenzoyl diphenyl phosphene oxide, 10-butyl-2-chloroacridone, 2-ethyl anthraquinone, benzyl, 9,10-phenanthrenequinone, camphor quinone, phenylglyoxylic acid methyl, titanocene, etc. may be used as additional photopolymerization initiators.

According to an example embodiment of the present disclosure, the photopolymerization initiation aid that may be combined with the photopolymerization initiator may be one or more compounds selected from an amine compound, a carboxylic acid compound, etc.

Non-limiting examples of the amine compound in the photopolymerization initiation aid may include an aliphatic amine compound (such as triethanolamine, methyldiethanolamine, and/or triisopropanolamine), an aromatic amine compound (such as 4-dimethylaminobenzoate methyl, 4-dimethylaminobenzoate ethyl, 4-dimethylaminobenzoate isoamyl, 4-dimethylaminobenzoate 2-ethylhexyl, benzoate 2-dimethylaminoethyl, N,N-dimethylpara-toluidine, 4,4'-bis(dimethylamino)benzophenone, and/or 4,4'-bis(diethylamino)benzophenone), etc. In some embodiments, an aromatic amine compound may be used.

Non-limiting examples of the carboxylic acid compound may include aromatic heterocyclic acetic acids (such as phenylthioacetic acid, methylphenylthioacetic acid, ethylphenylthioacetic acid, methylethylphenylthioacetic acid, dimethylphenylthioacetic acid, methoxyphenylthioacetic acid, dimethoxyphenylthioacetic acid, chlorophenylthioacetic acid, dichlorophenylthioacetic acid, N-phenylglycine, phenoxy acetic acid, naphthylthioacetic acid, N-naphthylglycine, naphthoxy acetic acid, etc.).

In the photosensitive resin composition according to an example embodiment of the present disclosure, the content of the photopolymerization initiator may be 0.1 wt % to 20 wt %, and in some embodiments, 1 wt % to 10 wt %, based on the weight of the entire solid content. The content of the photopolymerization initiation aid may be 0.1 wt % to 20 wt %, and in some embodiments, 1 wt % to 10 wt %, based on the total weight of the entire solid content.

When the amount of the photopolymerization initiator is within the above-described ranges, the photosensitive resin composition may be highly sensitive, such that the strength of the pixel unit and/or the smoothness in the pixel unit surface may be good. When the content (e.g., amount) of the photopolymerization initiation aid is within the above-described ranges, the sensitivity efficiency of the self-emissive photosensitive resin composition may be further increased and the productivity of the color conversion layer using the above-described composition may be improved.

Alkali-Soluble Resin

The alkali-soluble resin may enable removal of unexposed regions of the photosensitive resin layer, such that the exposed region is maintained. Also, the alkali-soluble resin according to an example embodiment of the present disclosure may aid in evenly dispersing quantum dots within the composition, may protect the quantum dots during processing, and may thereby have a function of maintaining the luminance of a device. To provide these effects, the alkali-soluble resin according to an example embodiment of the present disclosure may include at least one of the monomer represented by Formula 1 and the monomer represented by Formula 2:

Formula 1

In Formula 1, $R_1$, $R_2$, $R_3$, and $R_4$ may each independently be a hydrogen atom, a halogen atom, an alkyl group having 1 to 20 carbons, an alkoxy group having 1 to 20 carbons, a carbonyl group, an alkoxy carbonyl group, or an alkenyl group having 2 to 20 carbons.

Formula 2

In Formula 2, $R_5$, $R_6$, $R_7$, and $R_8$ may each independently be a hydrogen atom, a halogen atom, an alkyl group having 1 to 20 carbons, an alkoxy group having 1 to 20 carbons, a carbonyl group, an alkoxy carbonyl group, or an alkenyl group having 2 to 20 carbons.

When a ring structure such as those in Formula 1 and Formula 2 (e.g., a Lewis base) is provided, a substantially stable dispersion of the quantum dots and other components may be formed, and oxygen inhibition of radical curing may be reduced, thereby resulting in excellent curability. In addition, the cured resin may have high heat resistance, and the transparency may be good because a nitrogen atom is not included. Accordingly, during photosensitive photoresist manufacturing, the dispersion stability of the quantum dot may be increased so as to not cause disadvantages (e.g., defects) on the quantum dot surface by oxygen radicals generated in the photoresist manufacturing process, such that excellent luminance characteristics may be achieved.

The alkali-soluble resin may include at least one selected from a single polymer (e.g., homopolymer) formed from the monomer represented by Formula 1 and a single polymer (e.g., homopolymer) formed from the monomer represented by Formula 2, and may include at least one selected from a copolymer formed from the monomer represented by Formula 1 and an unsaturated monomer, and a copolymer formed from the monomer represented by Formula 2 and an unsaturated monomer. In the case of each copolymer, the copolymer may have a shape (e.g., structure) of an alternating copolymer, a random copolymer, or a block copolymer, but embodiments of the present disclosure are not limited thereto.

The unsaturated monomer may be a monomer represented by Formula 3:

Formula 3

In Formula 3, $R_9$ may be a hydrogen atom or an alkyl group having 1 to 20 carbons. Here, the alkyl group having 1 to 20 carbons may be substituted or unsubstituted.

In the alkyl group having 1 to 20 carbons, the term "substituted" indicates that one or more hydrogen atoms are independently replaced with a substituent selected from a halogen atom (F, Cl, Br, and/or I), a hydroxy group, a $C_1$ to $C_{20}$ alkoxy group, a nitro group, a cyano group, an amino group, an imino group, an azido group, an amidino group, a hydrazino group, a hydrazone group, a carbonyl group, a carbamoyl group, a thiol group, an ester group, an ether group, a carboxyl group or a salt thereof, a sulfonic acid group or a salt thereof, a phosphoric acid or a salt thereof, a $C_1$ to $C_{20}$ alkyl group, a $C_2$ to $C_{20}$ alkenyl group, a $C_2$ to $C_{20}$ alkynyl group, a $C_6$ to $C_{30}$ aryl group, a $C_3$ to $C_{20}$ cycloalkyl group, a $C_3$ to $C_{20}$ cycloalkenyl group, a $C_3$ to $C_{20}$ cycloalkynyl group, a $C_2$ to $C_{20}$ heterocycloalkyl group, a $C_2$ to $C_{20}$ heterocycloalkenyl group, a $C_2$ to $C_{20}$ heterocycloalkynyl group, a $C_3$ to $C_{30}$ heteroaryl group, and combinations thereof.

In the copolymers formed from the monomer represented by Formula 3, the sum (e.g., amount) of the monomer represented by Formula 1 or the sum (e.g., amount) of the monomer represented by Formula 2 may be 50 mol % to 90 mol % in the alkali-soluble resin, and the sum (e.g., amount) of the monomer represented by Formula 3 may be 10 mol % to 50 mol % in the alkali-soluble resin, based on the total moles of the monomer represented by Formula 1, the monomer represented by Formula 2, and the monomer represented by Formula 3. When the monomer amounts are in the above ranges, the balance of alkali solubility and heat resistance may be good, and the function of protecting the quantum dot may be performed in the color conversion layer manufacturing process.

In addition to the copolymer formed from the monomer represented by Formula 1 or the monomer represented by Formula 2 with the monomer represented by Formula 3, a monomer having unsaturated bonding may be further included for one or more purposes. In some embodiments, the unsaturated monomer may improve the photocurability and the heat curability of the alkali-soluble resin, thereby improving the chemical resistance and the heat resistance.

Non-limiting examples of the monomer having unsaturated bonding may include the monomer of an aromatic vinyl compound (such as styrene, α-methylstyrene, o-vinyltoluene, m-vinyltoluene, p-vinyltoluene, p-chlorostyrene, o-methoxystyrene, m-methoxystyrene, p-methoxystyrene, o-vinylbenzylmethylether, m-vinylbenzylmethylether, p-vinylbenzylmethylether, and/or indene), an unsaturated carboxylic acid ester (such as methyl(meth)acrylate, ethyl (meth)acrylate, n-propyl(meth)acrylate, i-propyl(meth) acrylate, n-butyl(meth)acrylate, i-butyl(meth)acrylate, sec-butyl(meth)acrylate, t-butyl(meth)acrylate, tricyclodecyl (meth)acrylate, 2-hydroxyethyl(meth)acrylate, 2-hydroxypropyl(meth)acrylate, 3-hydroxypropyl(meth) acrylate, 2-hydroxybutyl(meth)acrylate, 3-hydroxybutyl (meth)acrylate, 4-hydroxybutyl(meth)acrylate, allyl(meth) acrylate, benzyl(meth)acrylate, cyclohexyl(meth)acrylate, phenyl(meth)acrylate, 2-methoxyethyl(meth)acrylate, 2-phenoxyethyl(meth)acrylate, methoxydiethylene glycol (meth)acrylate, methoxytriethylene glycol (meth)acrylate, methoxypropylene glycol (meth)acrylate, methoxypropylene glycol (meth)acrylate, isobornyl(meth)acrylate, dicyclopentadienyl(meth)acrylate, adamantyl(meth)acrylate, norbornyl(meth)acrylate, 2-hydroxy-3-phenoxypropyl(meth) acrylate, and/or glycerol mono(meth)acrylate); an unsaturated carboxylic acid amino alkyl ester compound (such as 2-aminoethylacrylate, 2-aminoethyl(meth)acrylate, 2-dimethylaminoethyl(meth)acrylate, 2-aminopropyl(meth) acrylate, 2-dimethylaminopropyl(meth)acrylate, 3-aminopropyl(meth)acrylate, and/or 3-dimethylaminopropyl(meth) acrylate); a carboxylic acid vinyl ester compound (such as acetate vinyl, propionic acid vinyl, butyric acid vinyl, and/or benzoate vinyl); an unsaturated ether compound (such as vinyl methyl ether, vinyl ethyl ether, and/or allyl glycidyl ether); a cyanic vinyl compound (such as acrylonitrile, methacrylonitrile, α-chloroacrylonitrile, and/or cyanic vinylidene); an unsaturated amide (such as acrylamide, methacrylamide, α-chloroacrylamide, N-2-hydroxyethylacrylamide, and/or N-2-hydroxyethylmethacrylamide); an unsaturated imide compound (such as maleimide, N-benzylmaleimide, N-phenylmaleimide, and/or N-cyclohexylmaleimide); and an aliphatic conjugated diene (such as 1,3-butadiene, isoprene, and/or chloroprene).

In some embodiments, the alkali-soluble resin may have a weight average molecular weight (in terms of polystyrene) of 3,000 to 100,000, and in some embodiments, 5,000 to 40,000. When the weight average molecular weight is 3,000 to 100,000, the exposed region of the resin may be resistant to reduction (e.g., removal) during developing, while the solubility of the non-exposed region may be good.

In some embodiments, the acid value of the alkali-soluble resin may be 30 to 150 mg KOH/g of the photosensitive resin composition. When the acid value is less than 30 mg KOH/g, the solubility of the alkali developer may be low and there may be a risk of leaving a residue on the substrate. When the acid value is more than 150 mg KOH/g, the possibility of lifting of the pattern (e.g., dissolving the exposed region of the resin) may increase.

In some embodiments, the molecular weight distribution of the alkali-soluble resin may be 1.0 to 6.0, and in some embodiments, 1.5 to 4.0. When the molecular weight distribution is 1.0 to 6.0, excellent development properties may be ensured.

In the photosensitive resin composition according to an example embodiment of the present disclosure, the content of the alkali-soluble resin may be 5 wt % to 80 wt % based on the weight of the entire solid content. The alkali-soluble resin may realize (e.g., may enable formation of) the color conversion layer pattern in this range.

Solvent

The solvent according to an example embodiment of the present disclosure is not specifically limited, and may be an organic solvent used in the related art.

Non-limiting examples of the solvent may include ethylene glycol monoalkylethers (such as ethylene glycol monomethylether, ethylene glycol monoethylether, ethylene glycol monopropylether, ethylene glycol monobutylether, and/or the like); diethylene glycol dialkylethers (such as diethylene glycol dimethylether, diethylene glycol diethylether, diethylene glycol dipropylether, diethylene glycol dibutylether, and/or the like); ethylene glycol alkylether acetates (such as methylcellosolve acetate, ethylcellosolve acetate, and/or the like); propylene glycol dialkylethers (such as propylene glycol monomethylether, and/or the like); alkylene glycol alkyletheracetates (such as propylene glycol monomethylether acetate, propylene glycol monoethylether acetate, propylene glycol monopropylether acetate, methoxybutyl acetate, methoxypentyl acetate, and/or the like); aromatic hydrocarbons (such as benzene, toluene, xylene, mesitylene, and/or the like; ketones (such as methyl ethylketone, acetone, methyl amylketone, methyl isobutylketone, cyclohexanone, and/or the like); alcohols (such as ethanol, propanol, butanol, hexanol, cyclohexanol, ethylene glycol, glycerin, and/or the like); esters (such as 3-ethoxypropionic acid ethyl, 3-methoxypropionic acid methyl, and/or the like); and cyclic esters (such as γ-butyrolactone). They may be used alone or in combinations of two or more.

The content (e.g., amount or weight) of the solvent according to an example embodiment of the present disclosure is not particularly limited, and for example, may be included at 60 wt % to 90 wt % based on the total weight of the photosensitive resin composition, and in some embodiments, 70 wt % to 85 wt %. When the content of the solvent is 60 wt % to 90 wt %, the coating characteristics of the resin may be suitable.

Hereinafter, the color conversion layer manufactured using the above-described photosensitive resin composition will be described in more detail.

Color Conversion Layer

The color conversion layer may be included in the color conversion panel, and may include the pattern layer formed on the substrate included in a color panel.

The substrate may be a part where the color conversion layer is positioned in the display device, and is not particularly limited. The substrate may be a glass, silicon, silicon oxide, or polymer substrate, and the polymer substrate may be a polyether sulfone or a polycarbonate.

The pattern layer including the photosensitive resin composition according to an example embodiment of the present disclosure may be formed by coating the photosensitive resin composition and exposing, developing, and curing the coated photosensitive resin composition in a predetermined pattern.

The pattern layer formed of the photosensitive resin composition may include a red pattern layer including a red quantum dot, a green pattern layer including a green quantum dot, and a blue pattern layer including a blue quantum dot. The red pattern layer may emit red light, the green pattern layer may emit green light, and the blue pattern layer may emit blue light during light irradiation. When these pattern layers are applied to the display device, a white light source may be used.

According to an example embodiment of the present disclosure, the pattern layer may only include two selected from the red pattern layer, the green pattern layer, and the blue pattern layer. In this case, the pattern layer may further include a transparent pattern layer that does not include quantum dots.

In the case when only two color pattern layers are included, a light source that emits light of a wavelength that is not included in (e.g., generated by) the pattern layers may be used. Here, one or more suitable combinations are possible, and in terms of excellent color reproducibility, a light source emitting blue light may be used. For example, a pattern layer made of the photosensitive resin composition may include a red pattern layer and a green pattern layer, and a light source emitting blue light may be used. Here, the red quantum dot emits red light, the green quantum dot emits green light, and the blue light penetrates the transparent pattern layer as it is, thereby representing the blue (e.g., the blue portion of the spectrum).

Hereinafter, the display device including the above-described color conversion layer will be described in more detail.

Display Device

The above-described color conversion layer may be applied to one or more suitable image display devices (such as an organic light emitting diode display, a plasma display device, and/or a liquid crystal display). When the color conversion layer according to an example embodiment of the present disclosure is applied to the display device, light may be emitted in all directions by the quantum dot, such that the viewing angle is improved and improved luminance characteristics may be obtained, because the color conversion layer is formed of the photosensitive resin composition including the alkali-soluble resin with a ring structure as in Formula 1 and Formula 2.

The display device according to an example embodiment of the present disclosure may include a color conversion panel including the above-described color conversion layer and a display panel. The display panel may be a panel including the substrate, a thin film transistor, a signal line, an electrode, and the like, and may overlap the color conversion panel.

The color conversion panel may further include a partition formed between the pattern layers of the color conversion layer, and the partition may be a light blocking member. The color conversion panel may further include a passivation layer covering the pattern layer and the partition.

In some embodiments, the color conversion layer may not always be included in the display device within the color conversion panel, and may be formed directly in the display panel.

Next, an example of manufacturing the quantum dot and the alkali-soluble resin according to an example embodiment of the present disclosure will be described in more detail.

MANUFACTURING EXAMPLE 1

Synthesis of a Green Guantum Dot A with CdSe (Core)/ZnS (Shell) Structure

Cadmium oxide (0.4 mmol), zinc acetate (4 mmol), and oleic acid (5.5 mL) were added to a reactor along with 1-octadecene (20 mL) and heated to 150° C. The reaction product was allowed to stand for 20 min under a vacuum of 100 mTorr to remove the acetic acid generated by ligand exchange of the oleic acid with the zinc acetate. The reaction product was heated to 310° C. to obtain a transparent mixture, the transparent mixture was maintained for 20 min at 310° C., and then a Se and S solution including 0.4 mmol of Se powder and 2.3 mmol of S powder dissolved in 3 mL of trioctyl phosphine was quickly added to the cadmium oleate ($Cd(OA)_2$) and zinc oleate ($Zn(OA)_2$) solution in the reactor. The mixture was allowed to grow at 310° C. for 5 min, and the growth was stopped by using an ice-water bath. The mixture was precipitated with ethanol, the quantum dots were separated using a centrifugal separator, and extra impurities were washed away using chloroform and ethanol. The resulting quantum dot A having a CdSe (core)/ZnS (shell) structure stabilized with oleic acid were obtained with a particle size distribution of 3 nm to 5 nm (as the sum of the core size and the shell thickness).

MANUFACTURING EXAMPLE 2

Alkali-Soluble Resin Synthesis 2-1. Synthesis of an Alkali-Soluble Resin D1

23.3 g of methyl-2-(bromomethyl)-acrylate (Aldrich), 15.8 g of triethylamine (Aldrich), and 115.0 g of propylene glycol methylether (TCI) were added to a four-necked flask equipped with a dropping funnel, a thermometer, a cooling tube, and an agitator, and the atmosphere within the flask was replaced with nitrogen. Next, the four-necked flask was heated to 90° C., a solution of 15.1 g of methyl-2-(hydroxymethyl)-acrylate (Aldrich), 3.2 g of 2,2'-azobis isobutyronitrile (Wako), and 110.0 g of propylene glycol methylether (TCI) was added dropwise over 1 h. The resulting polymerization reaction was allowed to proceed for 0.5 h to generate a pyran-containing polymer. Next, a solution of 37.5 g of methacrylic acid, 19.0 g of methyl methacrylate, 225.0 g of propylene glycol methylether, and 3.2 g of 2,2'-azobis isobutyronitrile (Wako) was slowly added dropwise over 1 h, the polymerization reaction was allowed to proceed for 8 h, and the mixture was allowed to cool to room temperature. The atmosphere within the four-necked flask was replaced with nitrogen, and 61.5 parts by weight of glycidyl methacrylate (Mitsubishi Rayon), 3.6 g of tetra-N-butylammonium bromide (TCI), and 0.15 g of methoquinone (Junseyi) were added to the flask and the reaction was allowed to proceed for 12 h at 80° C., thereby adding the glycidyl methacrylate (GMA) to the carboxyl group of the copolymer to obtain the alkali-soluble resin D1. The weight average molecular weight of the alkali-soluble resin D1 was measured by gel permeation chromatography (GPC) to be 23,000.

2-2. Synthesis of an Alkali-Soluble Resin D2

37.5 g of methacrylic acid (Kyoeisha), 19.0 g of methyl methacrylate (Kyoeisha), 9.1 g of 2,5-dihydrofuran (TCI), and 225.0 g of propylene glycol methylether (TCI) were added to a four-necked flask equipped with a dropping funnel, a thermometer, a cooling tube, and an agitator, and the atmosphere of the four-necked flask was replaced with nitrogen. The flask was heated to 70° C., and a mixture solution of 37.5 g of methacrylic acid, 19.0 g of methylmethacrylate, 9.1 g of 2,5-dihydrofuran, 225.0 g of propylene glycol methylether, and 3.2 g of 2,2'-azobis isobutyronitrile (Wako) was slowly added dropwise over 1 h. The polymerization was allowed to proceed for 8 h, the resulting material was allowed to cool at room temperature, and the inside of the four-necked flask was substituted with nitrogen. Next, 61.5 parts by weight of glycidyl methacrylate (Mitsubishi Rayon), 3.6 g of tetra-N-butylammonium bromide (TCI), and 0.15 g of methoquinone (Junseyi) were added to the flask, and the reaction was allowed to proceed at 80° C. for 12 h to add the glycol methacrylate (GMA) to the carboxyl group of the copolymer, thereby obtaining the alkali-soluble resin D2.

The weight average molecular weight of the alkali-soluble resin D2 as measured by gel permeation chromatography was 17,000.

2-3. Synthesis of an Alkali-Soluble Resin D3

182 g of propylene glycol monomethylether acetate was placed in a flask equipped with an agitator, a thermometer, a reflux condenser, a dropping funnel, and a nitrogen inlet pipe, and the atmosphere in the flask was replaced with nitrogen. The temperature was increased to 100° C., and 105.7 g of benzylmethacrylate, 17.2 g of methacrylic acid, 26.0 g of 2-hydroxyethylmethacrylic acid, and 136 g of propylene glycol monomethylether acetate were added to the flask. A solution including 3.6 g of azobisisobutyronitrile was added dropwise over 2 h via the dropping funnel, and the reaction was stirred for 3 h at 100° C., thereby obtaining the alkali-soluble resin D3. The weight average molecular weight of the alkali-soluble resin D3 as measured by gel permeation chromatography (GPC) was 18,000.

2-4. Synthesis of an Alkali-Soluble Resin D4

182 g of propylene glycol monomethylether acetate at was placed in a flask equipped with an agitator, a thermometer, a reflux condenser, a dropping funnel, and a nitrogen inlet pipe, and the atmosphere in the flask was replaced with nitrogen. The temperature was increased to 100° C., 105.7 g of benzylmethacrylate, 34.4 g of methacrylic acid, and 136 g of propylene glycol monomethylether acetate were added, and a solution including 3.6 g of azobisisobutyronitrile was added dropwise over 2 h via the dropping funnel. The reaction was further stirred for 3 h at 100° C., thereby obtaining the alkali-soluble resin D4. The weight average molecular weight of the alkali-soluble resin D4 as measured by gel permeation chromatography (GPC) was 17,000.

Next, experimental examples of manufacturing the photosensitive resin composition according to an example embodiment of the present disclosure will be described along with comparative examples.

EXPERIMENTAL EXAMPLES 1 TO 4 AND COMPARATIVE EXAMPLES 1 AND 2

Preparation of Photosensitive Resin Composition

After mixing each component as described in Table 1, the resulting solids were diluted with propylene glycol monomethylether acetate to 20 wt % and were sufficiently stirred to obtain self-emissive photosensitive resin compositions.

The above-described alkali-soluble resins D1 and D2 were included in the photosensitive resin compositions of Experimental Example 1 to Experimental Example 4. The alkali-soluble resin D1 is a copolymer formed from the monomer represented by Formula 1 and the monomer represented by Formula 3, and the alkali-soluble resin D2 is a copolymer formed from the monomer represented by Formula 2 and the monomer represented by Formula 3.

The above-described alkali-soluble resins D3 and D4 were included in Comparative Example 1 and Comparative Example 2. The alkali-soluble resins D3 and D4 do not include the copolymer formed from the monomer represented by Formula 1 and the monomer represented by Formula 3 or the copolymer formed from the monomer represented by Formula 2 and the monomer represented by Formula 3.

TABLE 1

| Self-emissive photosensitive resin composition | | Experimental Example 1 | Experimental Example 2 | Experimental Example 3 | Experimental Example 4 | Comparative Example 1 | Comparative Example 2 |
|---|---|---|---|---|---|---|---|
| Quantum dot A | | 30 | 30 | 30 | 30 | 30 | 30 |
| Photopolymerizable compound | B-1 | 10 | 10 | 10 | 10 | 10 | 10 |
| | B-2 | 25 | 25 | 25 | 25 | 25 | 25 |
| Photopolymerization initiator | | 5 | 5 | 5 | 5 | 5 | 5 |
| Alkali-soluble resin | D1 | 30 | — | 15 | — | — | — |
| | D2 | — | 30 | — | 15 | — | — |
| | D3 | — | — | 15 | — | 30 | — |
| | D4 | — | — | — | 15 | — | 30 |

Quantum dot A: the quantum dot A with CdSe (core)/ZnS (shell) structure of Manufacturing Example 1

Photopolymerizable compound B-1: dipentaerythritol pentaacrylate succinic acid monoester (TO-1382, Dong-A synthesis)

Photopolymerizable compound B-2: dipentaerythritol hexaacrylate (KAYARAD DPHA; Nippon Kayaku)

Photopolymerization initiator: Irgacure-907 (BASF), Irgacure-907 is the acetophenone-based compound Alkali-soluble resin (D1-D4): the alkali-soluble resin of Manufacturing Example 2

Color Conversion Panel Manufacturing Example

Example color conversion panels including color conversion layers were manufactured using the self-emissive photosensitive resin compositions manufactured in Experimental Examples 1 to 4 and Comparative Examples 1 and 2. Each self-emissive photosensitive resin composition was coated on a glass substrate using a spin coating method, and each glass substrate was placed on a heating plate at a temperature of 100° C. for 3 min to form a thin film. A test photomask having a transmission pattern of 20 mm (width)× 20 mm (height) square and a line/space pattern of 1 μm to 100 μm was positioned on the thin film, and the mask was irradiated with ultraviolet rays at a distance of 100 μm from the test photomask.

The ultraviolet ray light source was an ultra-high pressure mercury lamp (product name: USH-250D); the irradiation was conducted at an exposure amount (365 nm) of 200 mJ/cm$^2$ under atmospheric conditions, and an optical filter was not used. After irradiation, the thin film was dipped in an aqueous KOH solution (pH 10.5) for developing. The glass substrate coated with the thin film was cleansed using distilled water, dried under a flow of nitrogen gas, and heated for 10 min in a heating oven at 150° C. to manufacture the color conversion layer pattern. The film thickness of the above-manufactured self-emissive color conversion layer pattern was 3.0 μm.

Luminance Intensity Measuring

Conversion of light emitted by a 365 nm tube-type (e.g., tube source) 4 W UV irradiator (VL-4LC, VILBER LOURMAT) was measured in the pattern part of the 20 mm×20 mm square of each color conversion layer formed with a self-emissive pixel. The luminance intensity in the 550 nm spectral region of each of Experimental Examples 1 to 4 and Comparative Examples 1 and 2 was measured using a spectrometer (Ocean Optics product). Excellent self-emissive characteristics may appear when the luminance intensity is high, and the luminance intensity measurements are shown in Table 2. A hard bake (e.g., annealing) was performed at 230° C. for 60 min. Each luminance intensity was measured before and after the hard bake to ascertain the level of emission efficiency maintenance, and the luminance intensity retention rates are shown in Table 2:

TABLE 2

| | Initial luminance intensity (relative strength [a.u.]) | Luminance intensity retention rate after hard bake |
|---|---|---|
| Comparative Example 1 | 29,652 | 33.5% |
| Comparative Example 2 | 28,682 | 35.6% |
| Experimental Example 1 | 40,853 | 56.1% |
| Experimental Example 2 | 41,232 | 58.8% |
| Experimental Example 3 | 36,521 | 42.6% |
| Experimental Example 4 | 34,691 | 43.8% |

As shown in Table 2, in the case of each of Experimental Examples 1 to 4, compared with each of Comparative Examples 1 and 2, it may be confirmed that the luminance intensity is excellent, and the luminance intensity is also highly maintained after the hard bake process at 230° C. In the case of Experimental Examples 1 to 4, the use of D1 and D2 alone enables good luminance maintenance compared with the use of D1 and D2 as a mixture with D3 and D4, as in the comparative examples. Through this result, it may be confirmed that outgas components generated by the binder during the hard bake process at 230° C. are reduced or decreased in the alkali-soluble resin having the ring structure of Formula 1 and Formula 2. Quantum dot oxidation is thereby suppressed or reduced, and excellent luminance intensity may be maintained after the hard bake process.

Next, the color conversion panel including the color conversion layer manufactured using the above-described photosensitive resin composition, and the display device including the color conversion panel will each be described in more detail with reference to the accompanying drawings.

Figure 1:
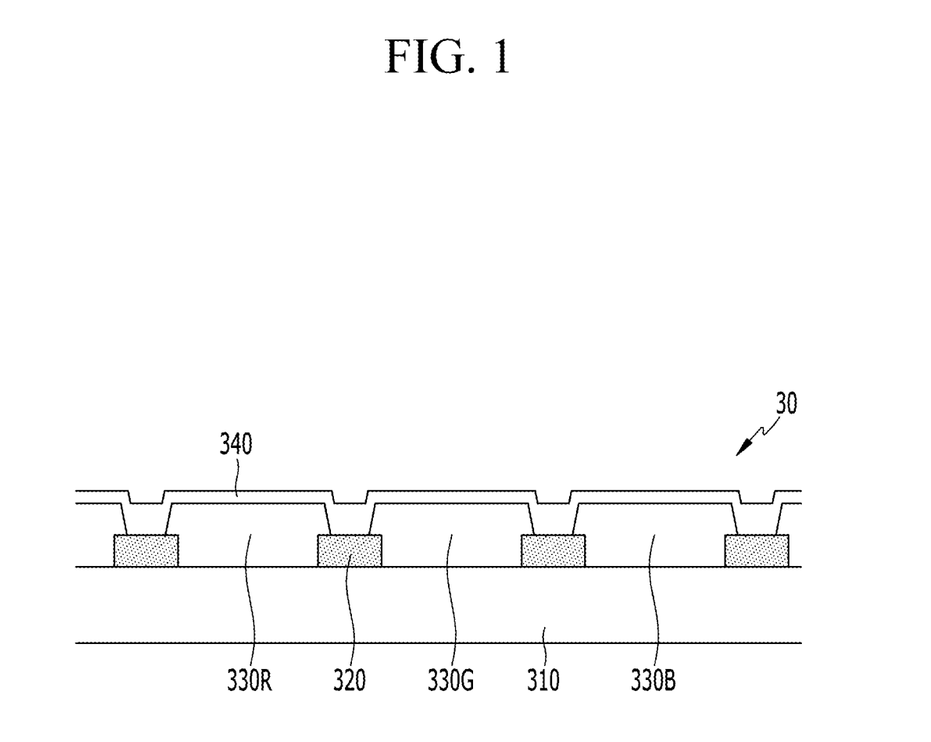
FIG. 1 is a cross-sectional view of a color conversion panel according to an example embodiment of the present disclosure.

FIG. 1 is a cross-sectional view of a color conversion panel according to an example embodiment of the present disclosure.

Referring to FIG. 1, the color conversion panel 30 according to an example embodiment of the present disclosure includes a plurality of color conversion layers 330R and 330G, a transmission layer 330B, and a light blocking member 320 on the substrate 310.

The plurality of color conversion layers 330R and 330G may emit light via a method of converting incident light of a set (e.g., predetermined) color into a different color light. As one example, the plurality of color conversion layers 330R and 330G may be a red color conversion layer 330R and a green color conversion layer 330G.

The transmission layer 330B may emit light by transmitting the predetermined or existing incident light. For example, the transmission layer 330B may transmit blue light.

The light blocking member 320 is between the adjacent color conversion layers 330R and 330G, and the adjacent color conversion layers 330R and 330G and transmission layer 330B. The light blocking member 320 may define the adjacent regions of the red color conversion layer 330R, the green color conversion layer 330G, and the transmission layer 330B.

The plurality of color conversion layers 330R and 330G may be formed using the above-described photosensitive resin composition according to an example embodiment of the present disclosure. The transmission layer 330B may be a polymer material transmitting blue light supplied by a light source. The transmission layer 330B, which corresponds to the region emitting blue light, emits incident blue light without using additional quantum dots.

The red color conversion layer 330R, the green color conversion layer 330G, the transmission layer 330B, and the light blocking member 320 may each include a photosensitive resin as one example, and accordingly, they may each be formed through a photolithography process. The red color conversion layer 330R may include quantum dots to convert the incident blue light into red light, and the green color conversion layer 330G may include quantum dots to convert the incident blue light into green light.

At least one among the plurality of color conversion layers 330R and 330G and the transmission layer 330B according to an example embodiment of the present disclosure may further include a scattering member (e.g., light scattering material). The scattering member scatters the incident light, and may thereby increase the amount of light that is emitted from the color conversion layers 330R and 330G and the transmission layer 330B, and/or may make the front luminance and lateral luminance substantially uniform (e.g., increase the viewing angle of the display panel).

As one example, the scattering member may include at least one selected from $TiO_2$, $Al_2O_3$, and $SiO_2$, but embodiments of the present disclosure are not limited thereto.

For example, the plurality of color conversion layers 330R and 330G and the transmission layer 330B may each include the scattering member, however, embodiments of the present disclosure are not limited thereto. In some embodiments, the transmission layer 330B may include the scattering member, and the red color conversion layer 330R and the green color conversion layer 330G may not include the scattering member.

A capping layer 340 as a passivation layer may be on the plurality of color conversion layers 330R and 330G, the transmission layer 330B, and the light blocking member 320. The capping layer 340 may prevent or protect the color conversion layers 330R and 330G and the transmission layer 330B from being damaged by high temperature processes after forming the color conversion layers 330R and 330G and the transmission layer 330B.

The capping layer 340 may be an inorganic material, for example, silicon nitride, and in some embodiments may not be provided.

A planarization layer may be formed on the capping layer 340.

In the above-described color conversion panel 30, incident light generated by the blue light source may be transmitted as is; however, the color generated by the light source may be changed when the colors corresponding to the color conversion layers 330R and 330G are changed. Further, the light generated by the white light source may pass through the color conversion panel, and in this case, the above-described transmission layer 330B may be replaced with a blue color conversion layer.

Figure 2:
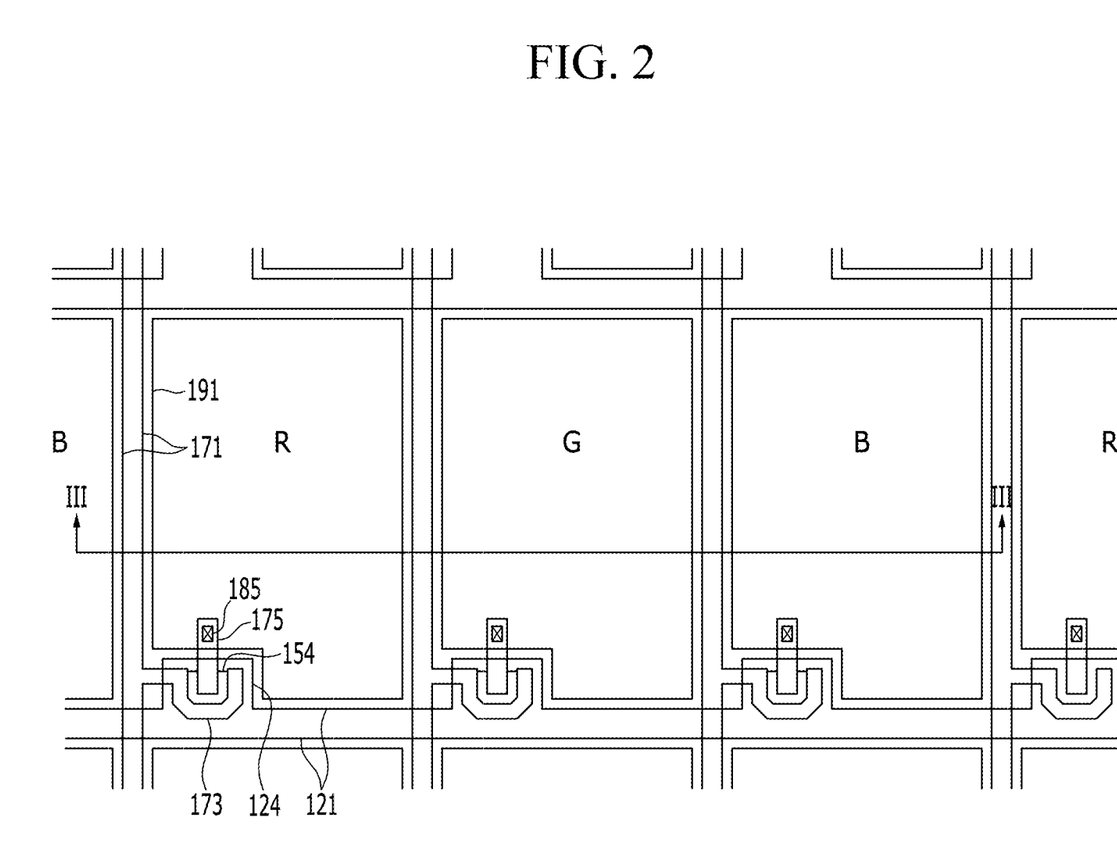
FIG. 2 is a top plan view of a liquid crystal display according to an example embodiment of the present disclosure.
Figure 3:
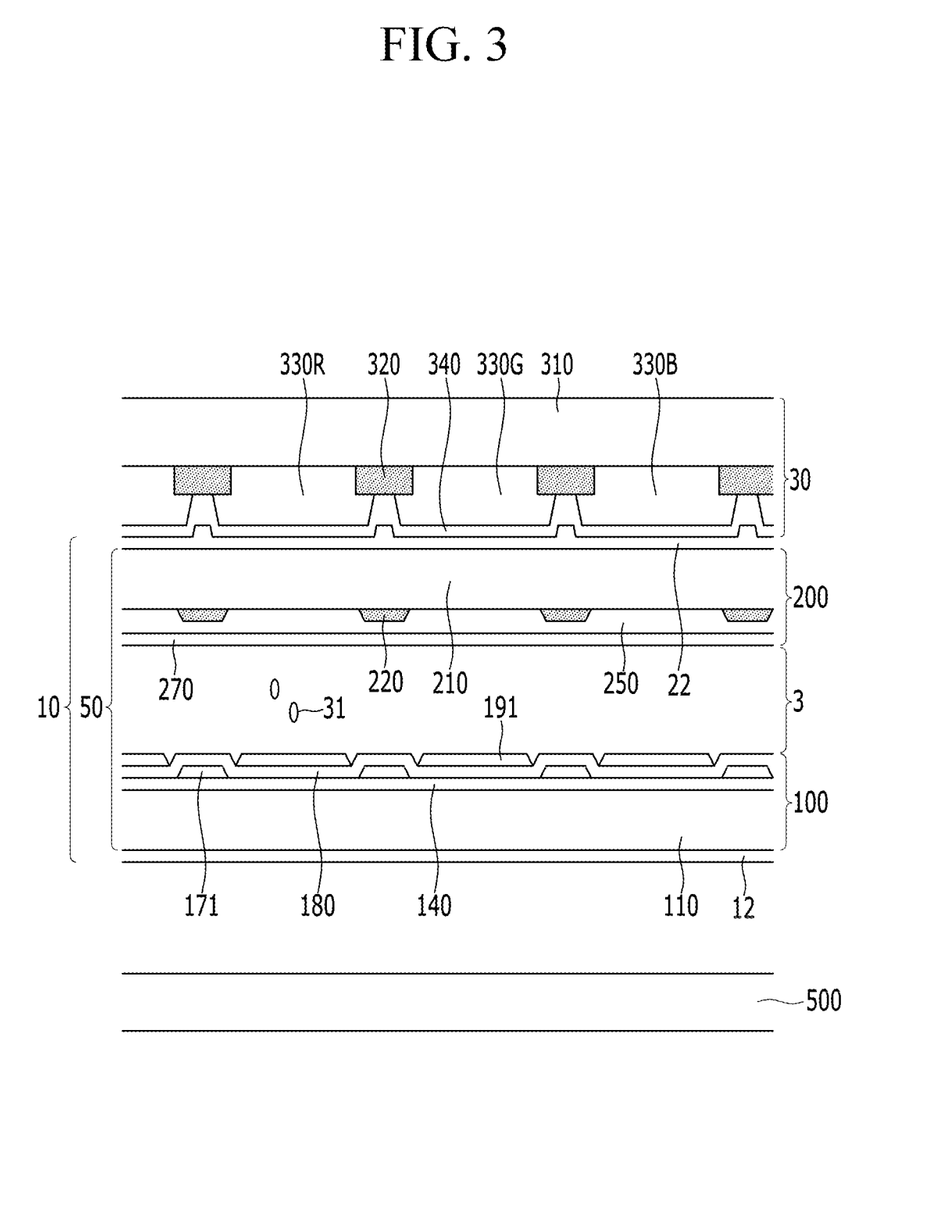
FIG. 3 is a cross-sectional view taken along a line III-III of FIG. 2.

FIG. 2 is a top plan view of a liquid crystal display according to an example embodiment of the present disclosure. FIG. 3 is a cross-sectional view taken along a line III-III of FIG. 2.

Referring to FIG. 2 and FIG. 3, a display panel 10 may include a liquid crystal panel 50 and polarizers 12 and 22 positioned on respective surfaces of the liquid crystal panel 50. The first polarizer 12 and the second polarizer 22 may polarize the light incident from the backlight assembly 500.

The liquid crystal panel 50 includes a lower panel 100 including a thin film transistor, an upper panel 200 including a second substrate 210 facing the lower panel 100, and a liquid crystal layer 3 between the lower panel 100 and the upper panel 200.

A plurality of pixel electrodes 191 are positioned in a matrix shape (e.g., pattern) on a first substrate 110 in the lower panel 100. The shape and the arrangement of the pixel electrodes 191 may be modified.

On the first substrate 110, a gate line 121 extending in a row direction and including a gate electrode 124, a gate insulating layer 140 on the gate line 121, a semiconductor layer 154 on the gate insulating layer 140, a data line 171 on the semiconductor layer 154 and extending in a column direction, a source electrode 173 and a drain electrode 175 connected with the data line 171, a passivation layer 180 on the data line 171 and the drain electrode 175, and a pixel electrode 191 physically and electrically connected to the drain electrode 175 through a contact hole 185 are formed.

The semiconductor layer 154 positioned on the gate electrode 124 forms a channel layer between the source electrode 173 and the drain electrode 175, and the gate electrode 124, the semiconductor layer 154, the source electrode 173, and the drain electrode 175 form one thin film transistor.

Next, the upper panel 200 will be described.

The second substrate 210 faces and is separated from the first substrate 110. A black matrix 220, an overcoat 250, and a common electrode 270 are between the second substrate 210 and the liquid crystal layer 3. In detail, the black matrix 220 is between the liquid crystal layer 3 and the second substrate 210. The overcoat 250 is between the liquid crystal layer 3 and the second substrate 210 while covering the black matrix 220. The common electrode 270 is between the liquid crystal layer 3 and the overcoat 250.

An alignment layer may be formed between the liquid crystal layer 3 and the pixel electrode 191 and between the liquid crystal layer 3 and the electrode 270.

A common voltage may be applied to the common electrode 270 and may form an electric field with the pixel electrode 191 to arrange the liquid crystal molecules 31 positioned in the liquid crystal layer 3 between the common electrode 270 and the pixel electrode 191.

The backlight assembly 500 is under the display panel 10, and the color conversion panel 30 described in FIG. 1 is on the display panel 10. In this case, the color conversion panel 30 shown in FIG. 1 is overturned to be positioned on the display panel 10, such that the substrate 310 of the color conversion panel 30 is positioned far away from the top end of the display panel 10.

The backlight assembly 500 may include at least one light emitting diode (LED), and in some embodiments, it may be a blue light emitting diode (LED).

The display device provides improved color reproducibility and contrast ratio through the color conversion panel.

Figure 4:
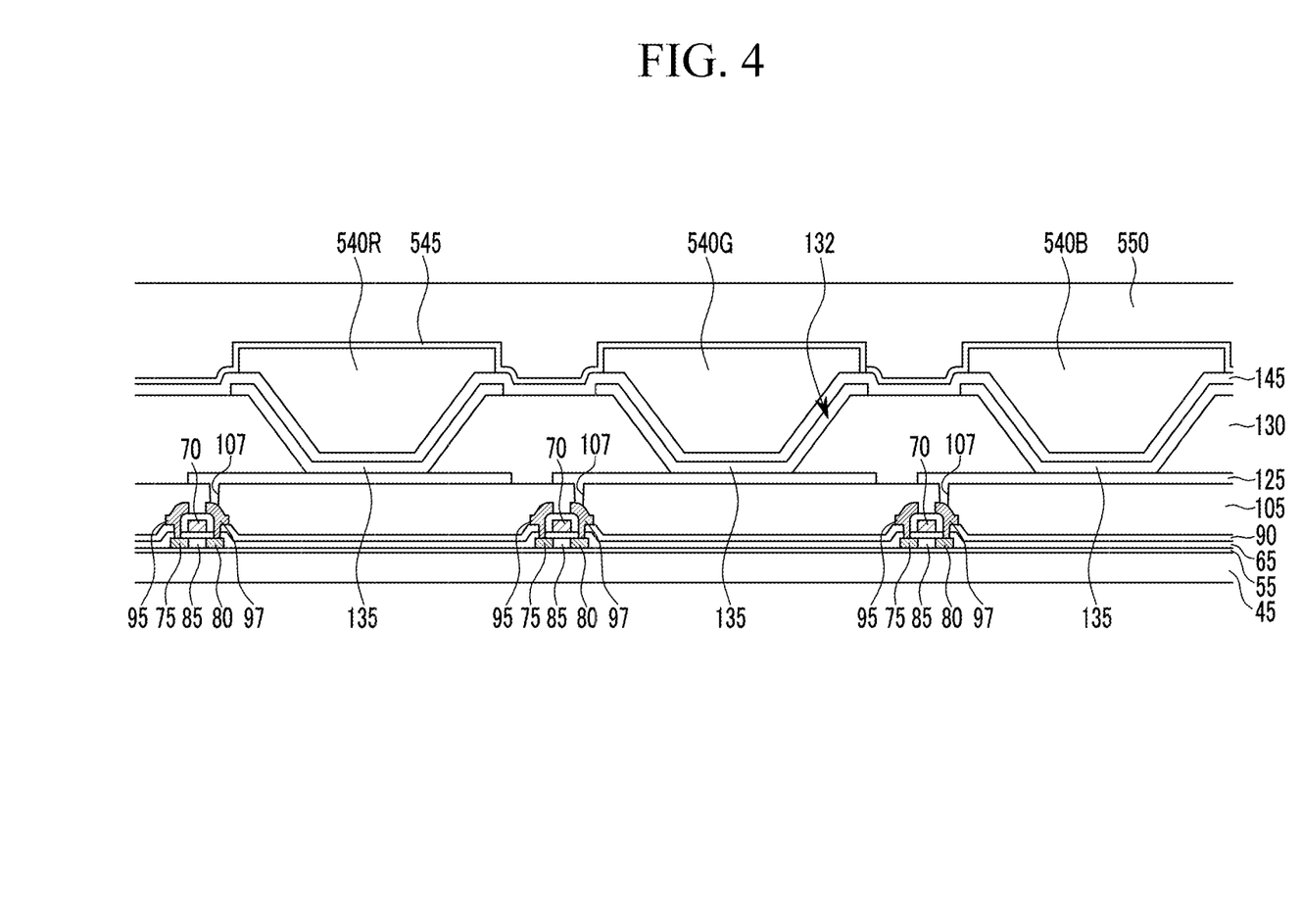
FIG. 4 is a cross-sectional view of an organic light emitting diode display according to an example embodiment of the present disclosure.

FIG. 4 is a cross-sectional view showing an organic light emitting diode display according to an example embodiment of the present disclosure.

Referring to FIG. 4, a buffer layer 55 is on a substrate 45, and a semiconductor layer is on the buffer layer 55. In the semiconductor layer, an extrinsic region includes a source region 75 and a drain region 80, and the source region 75 and the drain region 80 are separated from each other. A channel region 85 is formed between the source region 75 and the drain region 80.

A gate insulating layer 65 made of silicon oxide or silicon nitride is on the semiconductor layer and the buffer layer 55.

A gate electrode 70 is on the gate insulating layer 65. The gate electrode 70 may overlap the channel region 85 of the semiconductor layer. A gate line connected with the gate electrode 70 is positioned on the gate insulating layer 65 along with the gate electrode 70.

An interlayer insulating layer 90 covering the gate electrode 70 is positioned on the gate insulating layer 65. The interlayer insulating layer 90 may be formed to have a substantially uniform thickness on the gate insulating layer 65 along a profile of the gate electrode 70. Accordingly, a step part (e.g., stepped region) adjacent to the gate electrode 70 may be generated in the interlayer insulating layer 90.

A source electrode 95 and a drain electrode 97 are positioned on the interlayer insulating layer 90. The source electrode 95 and the drain electrode 97 are separated by a set or predetermined space interval based on (e.g., corresponding to) the gate electrode 70, and are positioned to be close to the gate electrode 70. Also, the source and drain electrodes 95 and 97 penetrate the interlayer insulating layer 90 and are respectively connected to the source and drain regions 75 and 80.

A data line crossing the gate line is positioned to be connected with the source electrode 95 on the interlayer insulating layer 90.

A passivation layer 105 is positioned on the source electrode 95 and the drain electrode 97. The passivation layer 105 may have a sufficient thickness to completely cover the source electrode 95 and the drain electrode 97.

A first electrode 125 is on the passivation layer 105. The first electrode 125 is connected with the drain electrode 97 through a contact hole 107 formed in the passivation layer 105.

A pixel definition layer 130 is on the passivation layer 105 and the first electrode 125. The pixel definition layer 130 may be formed of an organic material, an inorganic material, etc. In one example embodiment, the pixel defining layer 130 may be formed of a photoresist including a black pigment, in which case the pixel defining layer 130 may serve as a light blocking member.

An opening 132 that overlaps part of the first electrode 125 is formed in the pixel definition layer 130. The pixel definition layer 130 may divide the emission region into a light-emission region in a light-emitting element layer 135 (described elsewhere herein) and a non-emission region between adjacent light-emission regions in the organic light emitting diode display.

The light-emitting element layer 135 is positioned on the first electrode 125 and a second electrode 145 is positioned on the light-emitting element layer 135. The first electrode 125, the light-emitting element layer 135, and the second electrode 145 may configure (e.g., collectively form) an organic light emitting element.

The light-emitting element layer 135 according to the current example embodiment may include a multi-layered structure including a hole injection layer, a hole transporting layer, an organic emission layer, an electron transporting layer, an electron injection layer, etc. The organic emission layer may be formed of the blue emission layer in each pixel by using a material for generating blue light.

The color conversion layer including a red color conversion layer 540R and a green color conversion layer 540G and a transmission layer 540B is on the second electrode 145. Most (e.g., substantial areas) of the color conversion layer and the transmission layer 540B are positioned in the opening 132 between the pixel definition layer 130. The red color conversion layer 540R and the green color conversion layer 540G may be formed of the above-described photosensitive resin composition according to an example embodiment of the present disclosure.

A capping layer 545 is on the color conversion layer including the red color conversion layer 540R, the green color conversion layer 540G, and the transmission layer 540B. An encapsulation layer 550 is on the capping layer 545, thereby protecting the light-emitting element layer 135 from external oxygen and moisture.

In the example above, the organic emission layer is a blue emission layer; however, in some embodiments the organic emission layer may be changed into an emission layer representing another color and the colors of the color conversion layers 540R and 540G may be changed. In some embodiments, a plurality of emission materials representing different colors may be laminated to form the organic emission layer emitting white light, and in this case, the above-described transmission layer 540B may be replaced with a blue color conversion layer.

The positions of the color conversion layers 540R and 540G and the transmission layer 540B included in the organic light emitting diode display described in FIG. 4 may be modified or changed in one or more configurations. In some embodiments, the color conversion panel 30 including the color conversion layers 330R and 330G and the transmission layer 330B described in FIG. 1 may be formed by replacing the encapsulation layer 550 on the second electrode 145, or may be formed between the second electrode 145 and the encapsulation layer 550 or on the encapsulation layer 550 (e.g., instead of the color conversion layers 540R and 540G and the transmission layer 540B of FIG. 4). In this case, to locate the substrate 310 of the color conversion panel 30 of FIG. 1 away from the second electrode 145 of FIG. 4, the color conversion panel 30 shown in FIG. 1 may be overturned to be positioned on the second electrode 145. Here, an insulating layer may be formed between the color conversion panel and the second electrode 145.

As used herein, expressions such as "at least one of", "one of", and "selected from", when preceding a list of elements, modify the entire list of elements and do not modify the individual elements of the list. Further, the use of "may" when describing embodiments of the present disclosure refers to "one or more embodiments of the present disclosure".

In addition, as used herein, the terms "use", "using", and "used" may be considered synonymous with the terms "utilize", "utilizing", and "utilized", respectively.

As used herein, the terms "substantially", "about", and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While this disclosure has been described in connection with what is presently considered to be practical example embodiments, it is to be understood that the disclosure is not limited to the disclosed embodiments, but, on the contrary, is intended to cover various modifications and equivalent arrangements included within the spirit and scope of the appended claims and equivalents thereof.

DESCRIPTION OF SOME OF THE SYMBOLS

10: display panel
30: color conversion panel
330R, 540R: red color conversion layer
330G, 540G: green color conversion layer
330B, 540B: transmission layer

What is claimed is:

1. A photosensitive resin composition comprising:
a quantum dot, a photopolymerizable compound, a photopolymerization initiator, an alkali-soluble resin, and a solvent,
wherein the alkali-soluble resin includes at least one of a monomer represented by Formula 1 and a monomer represented by Formula 2:

Formula 1

Formula 2 wherein in Formula 1, $R_1$, $R_2$, $R_3$, and $R_4$ each independently represent a hydrogen atom, a halogen atom, an alkyl group having 1 to 20 carbons, an alkoxy group having 1 to 20 carbons, a carbonyl group, an alkoxy carbonyl group, or an alkenyl group having 2 to 20 carbons, and
in Formula 2, $R_5$, $R_6$, $R_7$, and $R_8$ each independently represent a hydrogen atom, a halogen atom, an alkyl group having 1 to 20 carbons, an alkoxy group having 1 to 20 carbons, a carbonyl group, an alkoxy carbonyl group, or an alkenyl group having 2 to 20 carbons.

2. The photosensitive resin composition of claim 1, wherein the alkali-soluble resin includes at least one of a polymer formed from the monomer represented by Formula 1 and a polymer formed from the monomer represented by Formula 2.

3. The photosensitive resin composition of claim 1, wherein the alkali-soluble resin further includes a monomer represented by Formula 3:

Formula 3 wherein in Formula 3, $R_9$ is a hydrogen atom or an alkyl group having 1 to 20 carbons.

4. The photosensitive resin composition of claim 3, wherein the alkali-soluble resin includes at least one selected from a copolymer formed from the monomer represented by Formula 1 and the monomer represented by Formula 3, and a copolymer formed from the monomer represented by Formula 2 and the monomer represented by Formula 3.

5. The photosensitive resin composition of claim 4, wherein a sum of the monomer represented by Formula 1 or a sum of the monomer represented by Formula 2 is 50 mol % to 90 mol % in the alkali-soluble resin, and a sum of the monomer represented by Formula 3 is 10 mol % to 50 mol % in the alkali-soluble resin, based on the total moles of the monomer represented by Formula 1, the monomer represented by Formula 2, and the monomer represented by Formula 3.

6. The photosensitive resin composition of claim 1, wherein the quantum dot comprises one selected from a red quantum dot, a green quantum dot, and a blue quantum dot.

7. The photosensitive resin composition of claim 6, wherein the quantum dot is 3 wt % to 80 wt % based on the entire solid weight of the photosensitive resin composition.

8. The photosensitive resin composition of claim 1, wherein the photopolymerizable compound includes at least one selected from nonylphenyl carbitol acrylate, 2-hydroxy-3-phenoxypropyl acrylate, 2-ethylhexyl carbitol acrylate, 2-hydroxyethyl acrylate, N-vinylpyrrolidone, 1,6-hexanediol di(meth)acrylate, ethylene glycol di(meth)acrylate, neopentyl glycol di(meth)acrylate, triethylene glycol di(meth)acrylate, bisphenol A bis(acryloyloxyethyl)ether, 3-methylpentanediol di(meth)acrylate, trimethylol propane tri(meth)acrylate, pentaerythritol tri(meth)acrylate, pentaerythritol tetra(meth)acrylate, dipentaerythritol penta(meth)acrylate, and dipentaerythritol hexa(meth)acrylate.

9. The photosensitive resin composition of claim 8, wherein the photopolymerizable compound is 5 wt % to 70 wt % based on the entire solid weight of the photosensitive resin composition.

10. The photosensitive resin composition of claim 1, wherein the photopolymerization initiator includes at least one selected from a triazine-based compound, an acetophenone-based compound, a biimidazole-based compound, an oxime compound, a benzoin-based compound, a benzophenone-based compound, a thioxanthone-based compound, and an anthracene-based compound.

11. The photosensitive resin composition of claim 10, wherein the photopolymerization initiator is present in an amount of 0.1 wt % to 20 wt % based on the entire solid weight of the photosensitive resin composition.

12. The photosensitive resin composition of claim 10, further comprising:
a photopolymerization initiation aid,
wherein the photopolymerization initiation aid includes at least one selected from an amine compound and a carboxylic acid compound.

13. The photosensitive resin composition of claim 1, wherein based on the entire solid weight of the photosensitive resin composition, the quantum dot is present in an amount of 3 wt % to 80 wt %, the photopolymerizable compound is present in an amount of 5 wt % to 70 wt %, the photopolymerization initiator is present in an amount of 0.1 wt % to 20 wt %, the alkali-soluble resin is present in an amount of 5 wt % to 80 wt %, and the solvent is present in an amount of 60 wt % to 90 wt %.

14. A display device comprising:
a color conversion layer,
wherein the color conversion layer is formed from a photosensitive resin composition including a quantum dot, a photopolymerizable compound, a photopolymerization initiator, an alkali-soluble resin, and a solvent, and
the alkali-soluble resin includes at least one of a monomer represented by Formula 1 and a monomer represented by Formula 2:

Formula 1

Formula 2 wherein in Formula 1, $R_1$, $R_2$, $R_3$, and $R_4$ each independently represent a hydrogen atom, a halogen atom, an alkyl group having 1 to 20 carbons, an alkoxy group having 1 to 20 carbons, a carbonyl group, an alkoxy carbonyl group, or an alkenyl group having 2 to 20 carbons, and
in Formula 2, $R_5$, $R_6$, $R_7$, and $R_8$ each independently represent a hydrogen atom, a halogen atom, an alkyl group having 1 to 20 carbons, an alkoxy group having 1 to 20 carbons, a carbonyl group, an alkoxy carbonyl group, or an alkenyl group having 2 to 20 carbons.

15. The display device of claim 14, wherein the alkali-soluble resin includes at least one of a polymer formed from the monomer represented by Formula 1 and a polymer formed from the monomer represented by Formula 2.

16. The display device of claim 14, wherein the alkali-soluble resin further includes a monomer represented by Formula 3:

Formula 3 wherein in Formula 3, $R_9$ is a hydrogen atom or an alkyl group having 1 to 20 carbons.

17. The display device of claim 16, wherein the alkali-soluble resin includes at least one selected from a copolymer formed from the monomer represented by Formula 1 and the monomer represented by Formula 3, and a copolymer formed from the monomer represented by Formula 2 and the monomer represented by Formula 3.

18. The display device of claim 14, wherein the color conversion layer includes a red color conversion layer and a green color conversion layer, and a transmission layer between the red color conversion layer and the green color conversion layer.

19. The display device of claim 18, further comprising a backlight assembly, wherein the backlight assembly is a blue light source.

20. The display device of claim 14, further comprising a backlight assembly, a display panel, and a color conversion panel,
wherein the display panel is on the backlight assembly and the color conversion panel is on the display panel, and
the color conversion panel includes the color conversion layer.

21. The display device of claim 20, further comprising an upper polarizer and a lower polarizer positioned on respective surfaces of the display panel, and the color conversion layer is positioned on the upper polarizer.

22. The display device of claim 14, further comprising:
a first electrode;
a second electrode overlapping the first electrode; and
an emission layer between the first electrode and the second electrode, and
the emission layer is a blue emission layer.

* * * * *